(12) United States Patent
Dhong et al.

(10) Patent No.: US 6,717,882 B1
(45) Date of Patent: Apr. 6, 2004

(54) CELL CIRCUIT FOR MULTIPORT MEMORY USING 3-WAY MULTIPLEXER

(75) Inventors: Sang Hoo Dhong, Austin, TX (US); Harm Peter Hofstee, Austin, TX (US); Shoji Onishi, Austin, TX (US); Osamu Takahashi, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/273,590

(22) Filed: Oct. 17, 2002

(51) Int. Cl.[7] .................................................. G11C 8/00

(52) U.S. Cl. .............................. 365/230.05; 365/189.02

(58) Field of Search ...................... 365/189.02, 230.05

(56) References Cited

U.S. PATENT DOCUMENTS 6,230,560 B1 * 5/2001 Suzuki ..................... 73/204.25

* cited by examiner

*Primary Examiner*—Michael Tran
(74) *Attorney, Agent, or Firm*—Carr LLP; Robert M. Carwell

(57) ABSTRACT

An improved cell circuit for data readout for use in a multiport memory is provided. The multiport memory stores write data signals. The cell circuit includes a plurality of multiplexers each coupled to a discharge device. Each of the multiplexers receives a subset of the write data signals and a plurality of read wordline signals and selects an output enable signal among the subset of the write data signals based on the read wordline signals. Each of the discharge devices are coupled to one of the multiplexers for receiving the output enable signal to generate a drive signal for driving one or more bitlines of the multiport memory.

19 Claims, 4 Drawing Sheets

US 6,717,882 B1

CELL CIRCUIT FOR MULTIPORT MEMORY USING 3-WAY MULTIPLEXER

CROSS REFERENCE TO RELATED APPLICATIONS

The present invention is related to a U.S. patent application entitled "CELL CIRCUIT FOR MULTIPORT MEMORY USING DECODER," Ser. No. 10/273,567 filed Oct. 17, 2002, assigned to the same assignee, and incorporated herein by reference.

BACKGROUND OF THE INVENTION

1. Field of the Invention

The invention relates generally to a multiport memory and, more particularly, to an improved cell circuit for data readout for use in a multiport memory.

2. Description of the Related Art

Current microelectronic circuits will achieve complicated systems with a great number of transistors, and the number will keep increasing in the future. Generally, these systems include a plurality of cooperating subsystems for processing data. One apparent problem with realizing these systems is the storage of the data to be processed, as well as their data processing programs. The most powerful systems will surely be realizable if a memory is available to which the subsystems can gain access chronologically parallel and with a high bandwidth. Such memories, which have multiple ports as external terminals, to which the external component units can gain access chronologically parallel, are generally known as multiport memories.

A prior-art multiport memory typically uses a large multiplexer to select one of a plurality of data store cell outputs, resulting in a relatively large space for a readout cell area for multiple read ports as well as a large number of read wordlines. Therefore, a need exists for a multiport memory with new multiple read ports configuration that takes up less space for a readout cell area by reducing both the readout cell area and the number of read wordlines.

SUMMARY OF THE INVENTION

The present invention provides a cell circuit for data readout in a multiport memory storing a plurality of write data signals. The cell circuit includes a multiplexer and a discharge device. The multiplexer receives a subset of the write data signals and a plurality of read wordline signals and selects an output enable signal among the subset of the write data signals based on the read wordline signals. The discharge device is coupled to the multiplexer for receiving the output enable signal to generate a drive signal for driving a bitline of the multiport memory.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, it will be obvious to those skilled in the art that the present invention may be practiced without such specific details. In other instances, well-known elements have been illustrated in schematic or block diagram form in order not to obscure the present invention in unnecessary detail.

Figure 1:
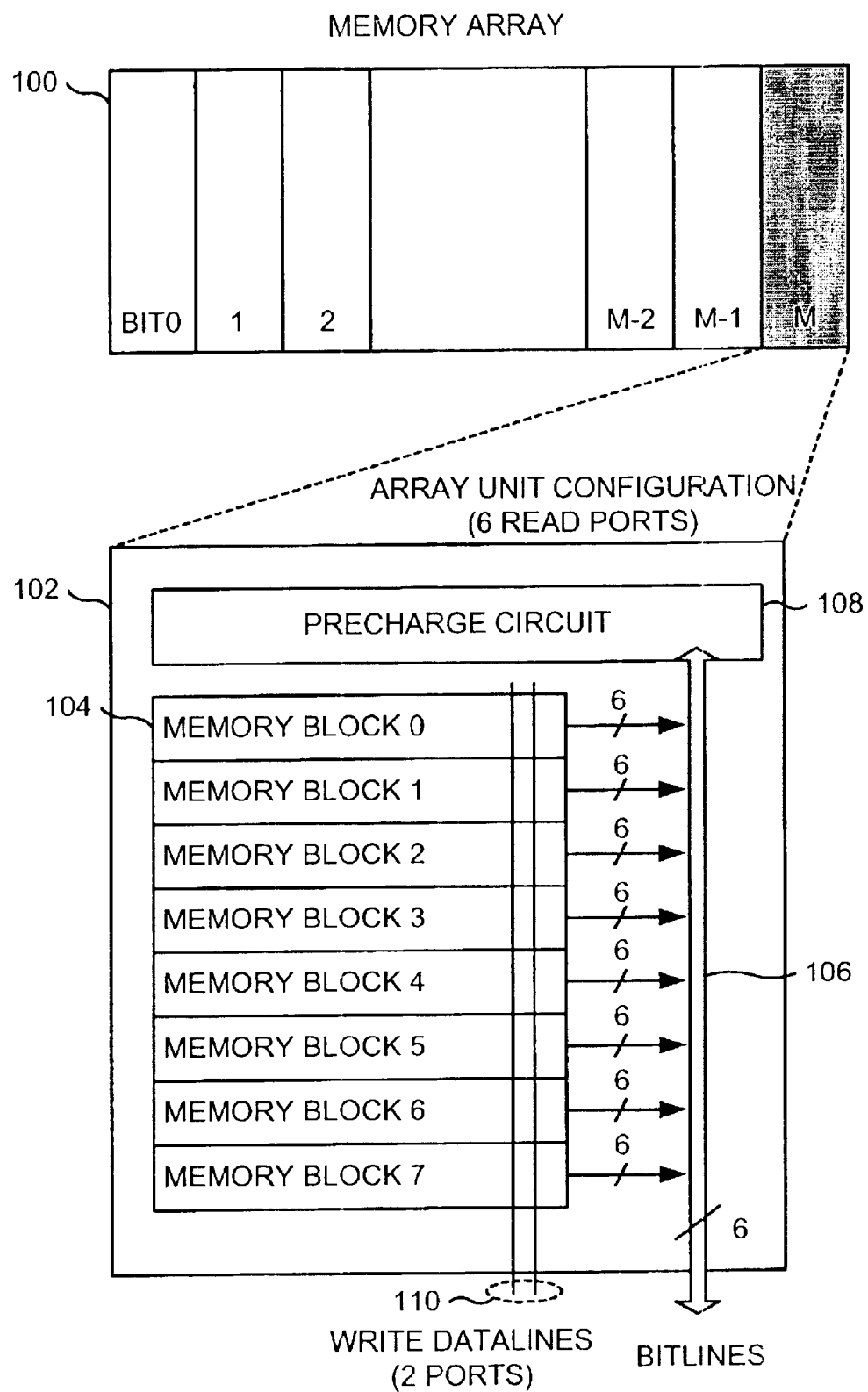
FIG. 1; depicts a multiport memory array structure in a block diagram.

Referring to FIG. 1 of the drawings, the reference numeral 100 generally designates a block diagram of a memory array having M+1 array units for bits 0 through M, wherein M is an integer larger than 0. In this figure, the memory array 100 is shown as an example to illustrate a 64 entry x M-bit array having two write ports and six read ports.

Figure 2:
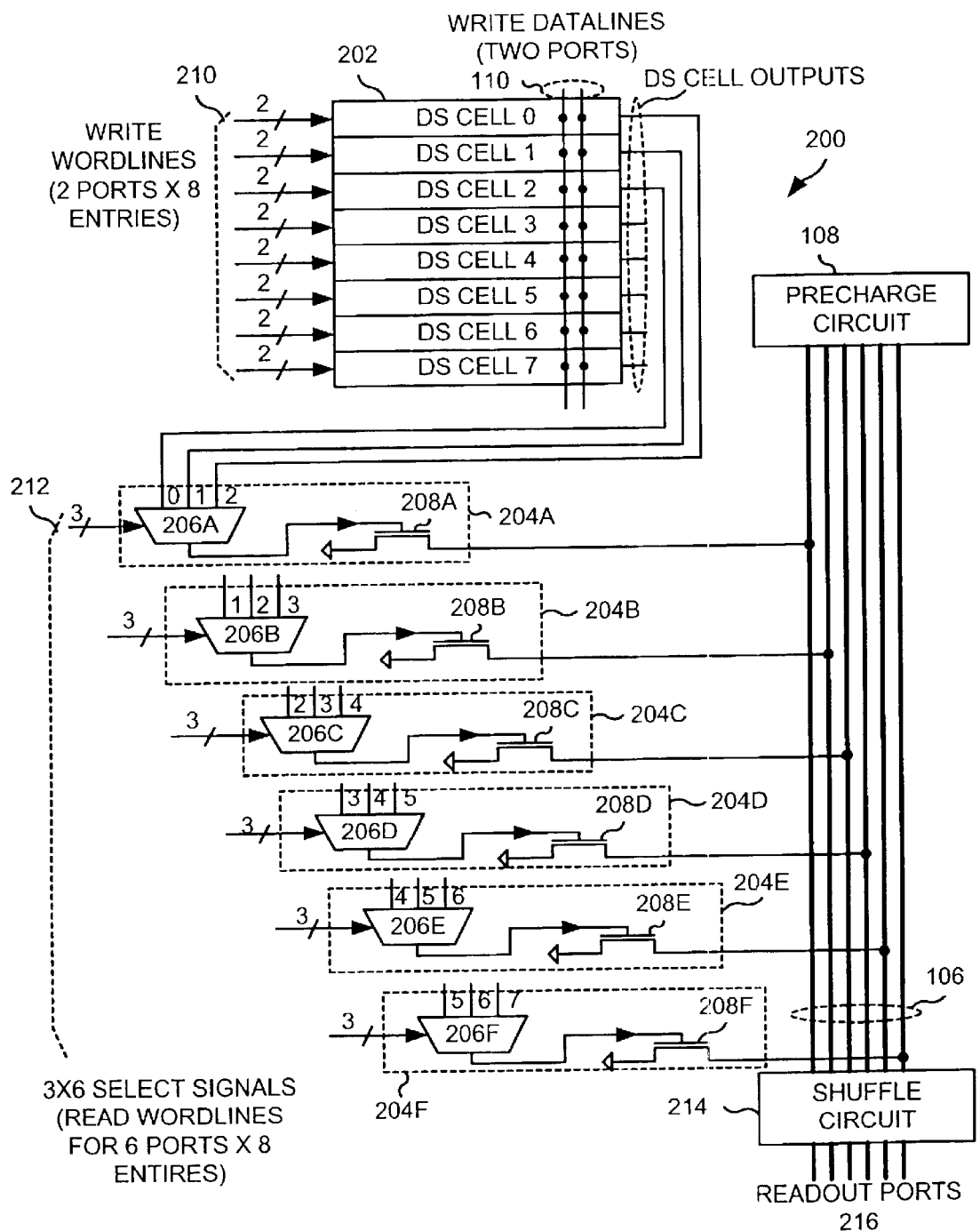
FIG. 2 is a schematic diagram of a memory block as shown in FIG. 1.

An array unit 102 for bit M is shown in further detail. The array unit 102 generally comprises a plurality of memory blocks 0–7 (hereinafter collectively referred to as "memory blocks 104") coupled to bitlines 106. In this example, the number of the bitlines 106 is six since there are six read ports in this configuration. Each of the memory blocks are coupled to the bitlines 106. Preferably, each bitline carries a dynamic ORed signal since a precharge circuit 108 is coupled to a discharge device (not shown) through each bitline. A more detailed illustration of these connections is shown in FIG. 2. Two write datalines 110 are coupled to each of the memory blocks 104 to provide two write data inputs (not shown) to each of the memory blocks 104. Each memory block also receives write wordlines (not shown) to select one of the two write data inputs.

Now referring to FIG. 2, a schematic diagram of a memory block 200 is depicted to illustrate any one of the memory blocks 104 of FIG. 1. The memory block 200 generally comprises a plurality of data store (DS) cells 0–7 (hereinafter collectively referred to as "DS cells 202"), coupled to a plurality of readout cells 204A, 204B, 204C, 204D, 204E, and 204F (hereinafter collectively referred to as "readout cells 204"). For example, DS cells 0–2 are coupled to the readout cell 204A. Similarly, there are also other connections (not shown for the sake of simplicity) between the DS cells 202 and the readout cells 204B–F. These connections are clearly indicated in each of the readout cells 204B–F and will be easily understood by a person with ordinary skill in the art in the context of the foregoing and following description.

Specifically, these additional connections are as follows. The DS cells 1–3 are coupled to the readout cell 204B. The DS cells 2–4 are coupled to the readout cell 204C. The DS cells 3–5 are coupled to the readout cell 204D. The DS cells 4–6 are coupled to the readout cell 204E. The DS cells 5–7 are coupled to the readout cell 204F. It is noted that this configuration is merely an example of many different possible configurations embodying the features of the present invention.

Each of the readout cells 204 has a 3:1 multiplexer and a discharge device coupled to the multiplexer. Specifically, the readout cell 204A comprises a multiplexer 206A and a discharge device 208A coupled to the multiplexer 206A. The readout cell 204B comprises a multiplexer 206B and a discharge device 208B coupled to the multiplexer 206B. The readout cell 204C comprises a multiplexer 206C and a discharge device 208C coupled to the multiplexer 206C. The readout cell 204D comprises a multiplexer 206D and a discharge device 208D coupled to the multiplexer 206D. The readout cell 204E comprises a multiplexer 206E and a discharge device 208E coupled to the multiplexer 206E. The readout cell 204F comprises a multiplexer 206F and a discharge device 208F coupled to the multiplexer 206F. The outputs of the readout cells 204 are coupled to the bitlines 106.

In this particular example, the DS cells 202 have eight entries; therefore, there are sixteen write wordlines 210 (2 ports×8 entries). There are six read ports; therefore, a prior-art configuration with a 8:1 multiplexer (not shown) would result in 48 read wordlines. In the memory block 200, by using 3:1 multiplexers 206A–F, the total number of read wordlines can be reduced to from 48 to 18.

The discharge devices 208A–F are respectively coupled to the precharge circuit 108 via the bitlines 106. Preferably, the read wordlines 212 are dynamic signals; therefore, output signals of the 3:1 multiplexers 206 become clock signals to enable the discharge device 208, and the bitlines 106 carry dynamic ORed signals. To improve data accessibility, a shuffle circuit 214 is used at the bottom of the bitlines 106. By using the shuffle circuit 214, each data output can be accessible through each of readout ports 216.

Figure 3:
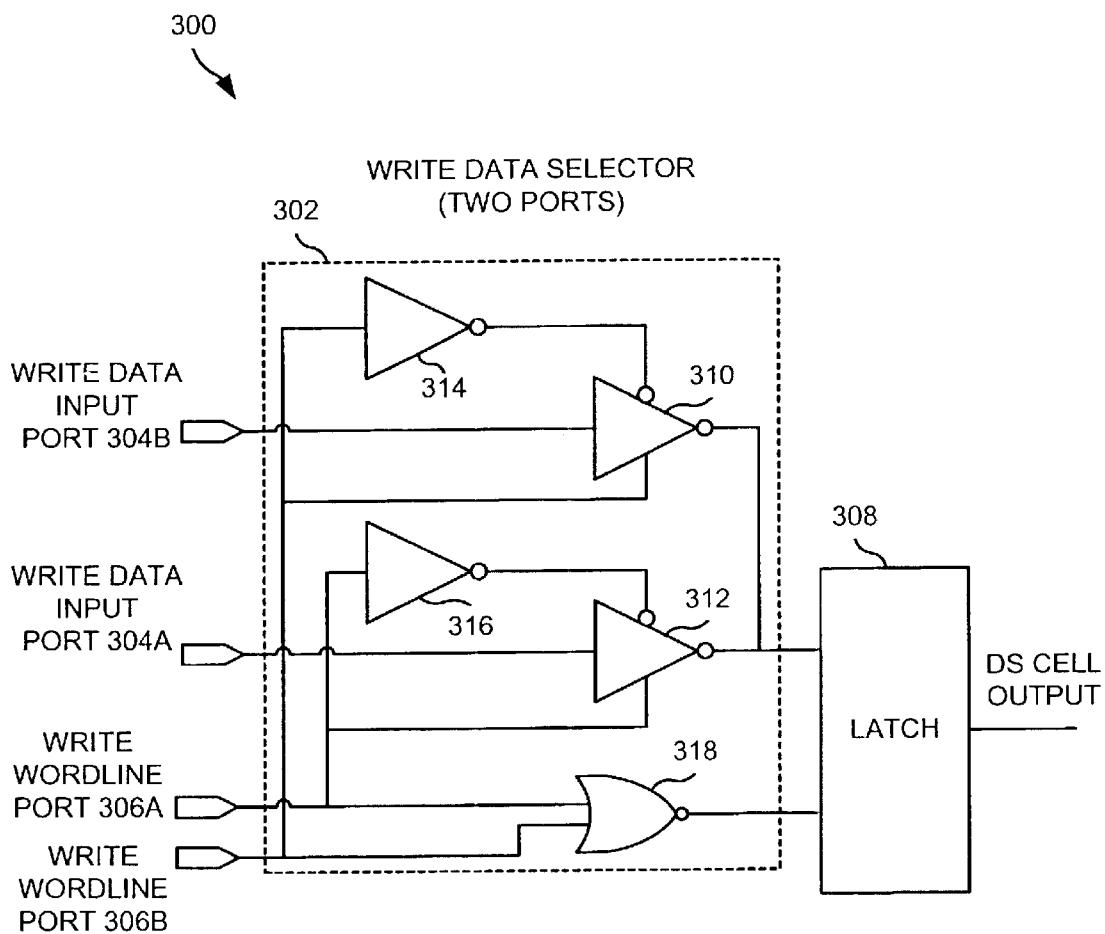
FIG. 3 is a schematic diagram of a data store cell circuit as shown in FIG. 2.

FIG. 3 depicts a schematic diagram of a data store (DS) cell circuit 300. Preferably, the DS cell circuit 300 represents any of the DS cells 202 of FIG. 2. The DS cell circuit 300 comprises a write data selector 302 having two write data input ports 304A and 304B for receiving first and second write data inputs in accordance with the examples having two write data inputs as shown in FIGS. 1 and 2. The write data selector 302 also includes two write wordline ports 306A and 306B for receiving first and second write wordlines, respectively, and selecting one of the two write data inputs or neither of them based on the first and second write wordlines.

The write data selector 302 is coupled to a latch 308, which outputs a DS cell output signal. The DS cell output signal is either updated with one of the two write data inputs or keeps a previous data (e.g., one of the two write data inputs in a previous clock cycle). The write data selector 304 generally comprises first and second three-state inventors 310 and 312 respectively coupled to the write data input port 304B and write data input port 304A.

The first three-state inverter 310 is coupled to a first inverter 314 for receiving as an enable signal an inverted signal of the output of the inverter 314. The first three-state inverter 310 is also coupled to the write wordline port 306B to receive as a complementary enable signal the second write wordline. Similarly, the three-state inverter 312 is coupled to a second inverter 316 for receiving as an enable signal an inverted signal of the output of the second inverter 316. The second three-state inverter 312 is also coupled to the write wordline port 306A to receive as a complementary enable signal the first write wordline. The write data selector 302 also includes a NOR gate 318 for determining whether the latch 308 should be updated with a new input or keep its current state.

Accordingly, the operation of the DS cell circuit 300 is as follows. When only the first write wordline is asserted, the write data selector 302 outputs only the first write data input through the second three-state inverter 312. This is because the first three-state inverter 310 is not enabled. In this case, the output of the NOR gate 318 is not asserted, resulting in an update of the DS cell output signal with the first write data input.

Similarly, when only the second write wordline is asserted, the write data selector 302 outputs only the second write data input through the first three-state inverter 310. This is because the second three-state inverter 312 is not enabled. In this case, the output of the NOR gate 318 is not asserted, resulting in an update of the DS cell output signal with the second write data input.

When both the first and second write wordlines are disabled, the NOR gate 318 disables the latch 308 and the DS cell output signal keeps its previous data.

Figure 4:
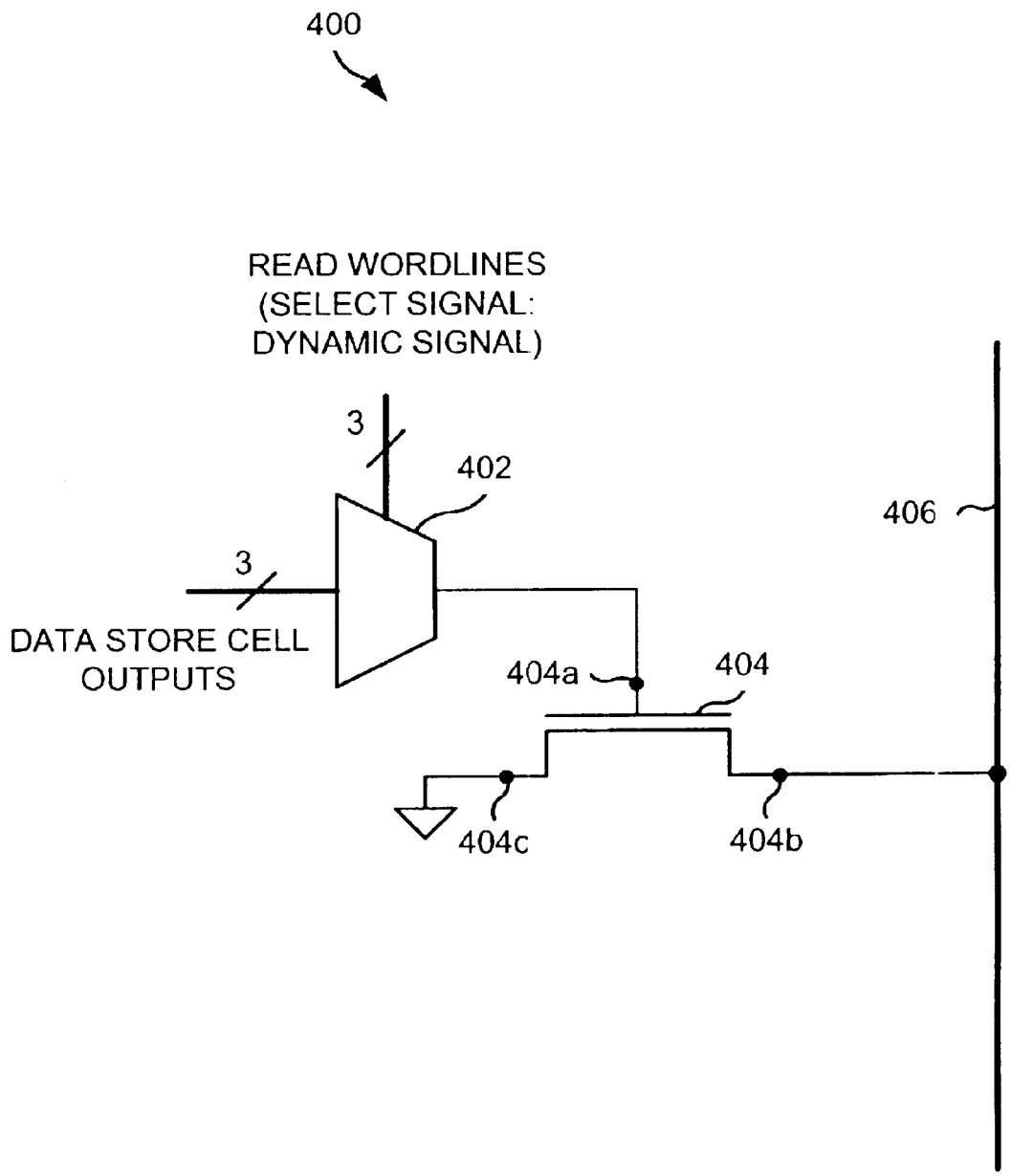
FIG. 4 is a schematic diagram of a readout cell circuit as shown in FIG. 2.

FIG. 4 shows a schematic diagram of a readout cell circuit 400. Preferably, the readout cell circuit 400 represents any of the readout cells 204A–F of FIG. 2. The readout cell circuit 400 comprises a static 3:1 data multiplexer 402 and a discharge device 404. The 3:1 multiplexer 402 selects one of the three DS cell outputs as a control signal, which input to the discharge device 404. Preferably, the discharge device 404 comprises a metal-oxide-silicon (MOS) transistor having a gate terminal 404a, drain terminal 404b, and source terminal 404c. The gate terminal 404a is coupled to the output of the multiplexer 402 for receiving the DS cell output. The drain terminal 404b is coupled to a bitline 406 for driving the bitline 406. The source terminal 404c is coupled to ground.

It will be understood from the foregoing description that various modifications and changes may be made in the preferred embodiment of the present invention without departing from its true spirit. This description is intended for purposes of illustration only and should not be construed in a limiting sense. The scope of this invention should be limited only by the language of the following claims.

What is claimed is:

1. A cell circuit for data readout in a multiport memory storing a plurality of write data signals, the cell circuit comprising:
    a multiplexer receiving a subset of the write data signals and a plurality of read wordline signals and selecting an output enable signal among the subset of the write data signals based on the read wordline signals; and
    a discharge device coupled to the multiplexer for receiving the output enable signal to generate a drive signal for driving a bitline of the multiport memory.

2. The cell circuit of claim 1, wherein the discharge device receives the output enable signal as a control signal.

3. The cell circuit of claim 1, wherein the discharge device comprises a metal-oxide-silicon (MOS) transistor having a gate, drain and source terminal.

4. The cell circuit of claim 3, wherein the gate terminal of the MOS transistor is coupled to the multiplexer for receiving the output enable signal.

5. The cell circuit of claim 1, wherein the multiport memory comprises a plurality of data store cells for storing the plurality of write data signals, a subset of the data store cells storing the subset of the write data signals, wherein each data store cell in the subset of the data store cells stores each write data signal in the subset of the write data signal.

6. The cell circuit of claim 5, wherein the cell circuit is coupled to the data store cells for receiving the subset of the write data signals.

7. The cell circuit of claim 1, wherein the multiport memory comprises one or more write datalines and one or more write wordlines for selecting the plurality of write data signals among the write datalines based on the one or more write wordlines.

8. The cell circuit of claim 5, wherein the multiplexer coupled to the subset of the data store cells for receiving the subset of the write data signals.

9. The cell circuit of claim 5, wherein each of the data store cells comprises:
    a write data selector for receiving a plurality of write data input signals and a plurality of write wordlines and selecting one of the write data input signals based on the write wordlines; and a latch for receiving the write wordlines and coupled to the write data selector.

10. The cell circuit of claim 9, wherein each write wordline enables a particular write data input signal to the latch, and wherein the latch keeps a previous output when all of the write wordlines are disabled.

11. A multiport memory comprising:

a plurality of data store cells for storing a plurality of write data signals and having N subsets of the data store cells, the N subsets of the data store cells storing N subsets of the write data signals; and N readout cells, each of the N readout cells being coupled to each of the N subsets of data store cells for receiving each of the N subsets of the write data signals, wherein each of the N readout cells comprises:

a multiplexer receiving a subset of the write data signals and a plurality of read wordline signals and selecting an output enable signal among the subset of the write data signals based on the read wordline signals; and a discharge device coupled to the multiplexer for receiving the output enable signal to generate a drive signal for driving a bitline of the multiport memory.

12. The multiport memory of claim 11, wherein the discharge device receives the output enable signal as a control signal.

13. The multiport memory of claim 11, wherein the discharge device comprises a metal-oxide-silicon (MOS) transistor having a gate, drain, and source terminal.

14. The multiport memory of claim 13, wherein the gate terminal of the MOS transistor is coupled to the multiplexer for receiving the output enable signal.

15. The multiport memory of claim 11, wherein each of the data store cells comprises:

a write data selector for receiving a plurality of write data input signals and a plurality of write wordlines and selecting one of the write data input signals based on the write wordlines; and a latch for receiving the write wordlines and coupled to the write data selector.

16. The multiport memory of claim 15, wherein each write wordline enables a particular write data input signal to the latch, and wherein the latch keeps a previous output when all of the write wordlines are disabled.

17. The multiport memory of claim 11, further comprising a precharge circuit coupled to the discharge device.

18. The multiport memory of claim 11, wherein the bitline comprises a dynamic ORed signal.

19. The multiport memory of claim 11, further comprising a shuffle circuit for improved accessibility of data in the readout cells.

* * * * *